(12) United States Patent
Naji

(10) Patent No.: US 6,272,041 B1
(45) Date of Patent: Aug. 7, 2001

(54) MTJ MRAM PARALLEL-PARALLEL ARCHITECTURE

(75) Inventor: Peter K. Naji, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/649,562

(22) Filed: Aug. 28, 2000

(51) Int. Cl.$^7$ .................................................. G11C 11/14
(52) U.S. Cl. .......................................... 365/171; 365/158
(58) Field of Search ...................................... 365/158, 171

(56) References Cited

U.S. PATENT DOCUMENTS 5,852,574 * 12/1998 Naji ...................................... 365/158

* cited by examiner

Primary Examiner—David Nelms
Assistant Examiner—M. Tran
(74) Attorney, Agent, or Firm—William E. Koch

(57) ABSTRACT

Magnetic tunnel junction random access memory parallel-parallel architecture wherein an array of memory cells is arranged in rows and columns with each memory cell including a magnetic tunnel junction and a control transistor connected in series. The array of memory cells is constructed with a plurality of columns and each column includes a global bit line coupled to a control circuit. Each column further includes a plurality of local bit lines coupled in parallel to the global bit line and a plurality of groups of memory cells, with each group including a plurality of memory cells connected in parallel between the local bit line and a reference potential.

19 Claims, 5 Drawing Sheets

MTJ MRAM PARALLEL-PARALLEL ARCHITECTURE

FIELD OF THE INVENTION

The present invention relates in general to Magnetoresistive Random Access Memories (MRAMs), and more particularly to magnetic tunnel junction (MTJ) MRAM arrays and a specific architecture for connecting the arrays.

BACKGROUND OF THE INVENTION

The architecture for Magnetoresistive Random Access Memory (MRAM) is composed of a plurality or array of memory cells and a plurality of digit line and bit line intersections. The magnetoresistive memory cell generally used is composed of a magnetic tunnel junction (MTJ), an isolation transistor, and the intersection of digit and bit lines. The isolation transistor is generally a N-channel field effect transistor (FET). An interconnect stack connects the isolation transistor to the MTJ device, to the bit line, and to the digit line used to create part of the magnetic field for programming the MRAM cell.

MTJ memory cells generally include a non-magnetic conductor forming a lower electrical contact, a pinned magnetic layer, a tunnel barrier layer positioned on the pinned layer, and a free magnetic layer positioned on the tunnel barrier layer with an upper contact on the free magnetic layer.

The pinned layer of magnetic material has a magnetic vector that is always pointed in the same direction. The magnetic vector of the free layer is free, but constrained by the physical size of the layer, to point in either of two directions. An MTJ cell is used by connecting it in a circuit such that electricity flows vertically through the cell from one of the layers to the other. The MTJ cell can be electrically represented as a resistor and the size of the resistance depends upon the orientation of the magnetic vectors. As is understood by those skilled in the art, the MTJ cell has a relatively high resistance when the magnetic vectors are misaligned (point in opposite directions) and a relatively low resistance when the magnetic vectors are aligned.

It is of course desirable to have the low resistance (aligned vectors) as low as possible, and the high resistance (misaligned vectors) much higher than the low resistance so that the change can be easily detected in associated electronic circuitry. The difference between the high and low resistance is generally referred to as the magnetic ratio (MR) with the difference generally being expressed in a percent (%), hereinafter the MR%.

Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

A bit line is generally associated with each column of an array of MTJ cells and a digit line is associated with each row of the array. The bit lines and digit lines are used to address individual cells in the array for both reading and programming or storing information in the array. Programming of a selected cell is accomplished by passing predetermined currents through the digit and bit lines intersecting at the selected cell. Several problems are prevalent in the standard memory architecture, including high programming or read currents, insufficient spacing between cells during programming, difficulty in sensing resistance changes because of long and/or high resistance bit and digit lines, and poor speed (generally in reading stored data).

Thus, it is desirable to provide architectures for MRAM memories that overcome some or all of these problems.

BRIEF DESCRIPTION OF THE DRAWINGS

The specific objects and advantages of the present invention will become readily apparent to those skilled in the art from the following detailed description thereof taken in conjunction with the drawings in which.

DESCRIPTION OF THE PREFERRED EMBODIMENTS

Figures 1, 2:
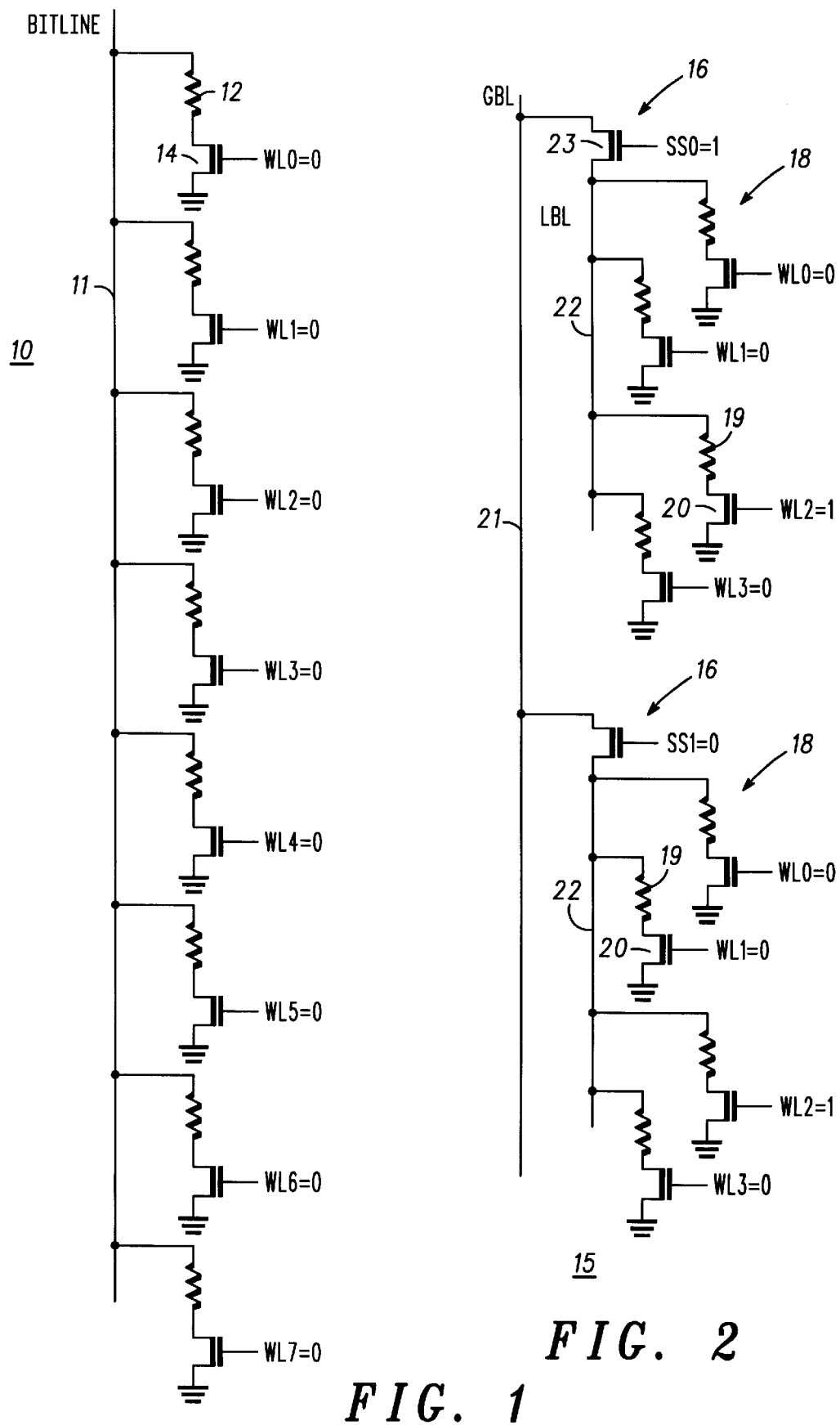
FIG. 1 is a schematic diagram of an MTJ memory array, portions thereof removed, connected in a common architecture.
FIG. 2 is a schematic diagram of an MTJ memory array, portions thereof removed, connected in a parallel-parallel architecture in accordance with the present invention.

Turning to FIG. 1, a schematic diagram of an MTJ memory array 10 connected in a common parallel architecture is illustrated. Throughout this disclosure MTJ memory cells will be depicted as a simple resistor or a variable resistor to simplify the drawings and disclosure. A single column of MTJ memory cells from array 10 are illustrated in FIG. 1, since each of the other columns will be similar and need not be described individually. The single column includes a bit line 11 coupled to one terminal of each MTJ cell 12 in the column. Each MTJ cell has a control transistor 14 connected to a second terminal and to a common junction, such as ground. Thus, each MTJ cell 12 in the column and its associated control transistor 14 is connected in parallel between bit line 11 and ground. Word lines, WL0. WL1. WL2, etc., extending along the rows of MTJ cells are connected to the gate of each transistor 14 in a row.

To read a bit of stored data, a column select transistor (not shown) is activated to select a specific column and a selected word line is activated to turn on a specific transistor 14. Since only the specific transistor 14 associated with a selected MTJ cell 12 is activated, only the selected MTJ cell is connected to the selected bit line 11. Generally, during a read operation a first bit line 11 will be activated and the word lines will then be sampled sequentially from WL0 to WLn. When this architecture is used in a random access memory (RAM), selected bits can be addressed by selecting appropriate bit lines and word lines.

The problems with this architecture clearly are that accessing stored data is relatively slow and the MTJ array is unnecessarily large. Further, as the array size is increased and bit lines get longer and more MTJ cells are attached to the bit lines, the capacitance due to MTJ capacitance, transistor junction capacitance, and line capacitance increases. This increased capacitance seriously decreases the speed of operation.

Turning now to FIG. 2, a schematic diagram is illustrated of a parallel-parallel architecture in accordance with the present invention. Only a single column 15 of an MTJ array with two parallel groups 16 and 17 of MTJ memory cells 18 is illustrated for ease of understanding. Each MTJ memory cell 18 includes a magnetic tunnel junction 19 connected in series with a control transistor 20. Column 15 includes a global bit line 21 and MTJ cells 18 of each group of cells 16 and 17 are connected in parallel between a local bit line 22 and a reference potential such as ground. Each local bit line 22 is connected in parallel to global bit line 21 by a group select transistor 23. Corresponding group select transistors 23 in the columns of the array are connected in rows and memory cells 18 are arranged in rows with the control electrodes of the control transistors in memory cells 18 connected in rows by control lines, hereinafter referred to as word lines and designated WL0 through WL3.

Here it should be specifically noted that only a selected local bit line 22 will be connected to global bit line 21 and any specific instance. Thus, the bit line capacitance is drastically reduced as compared to architectures such as that illustrated in FIG. 1. This drastic reduction in bit line capacitance substantially increases the operation of MTJ RAMs with the parallel-parallel architecture.

Figure 3:
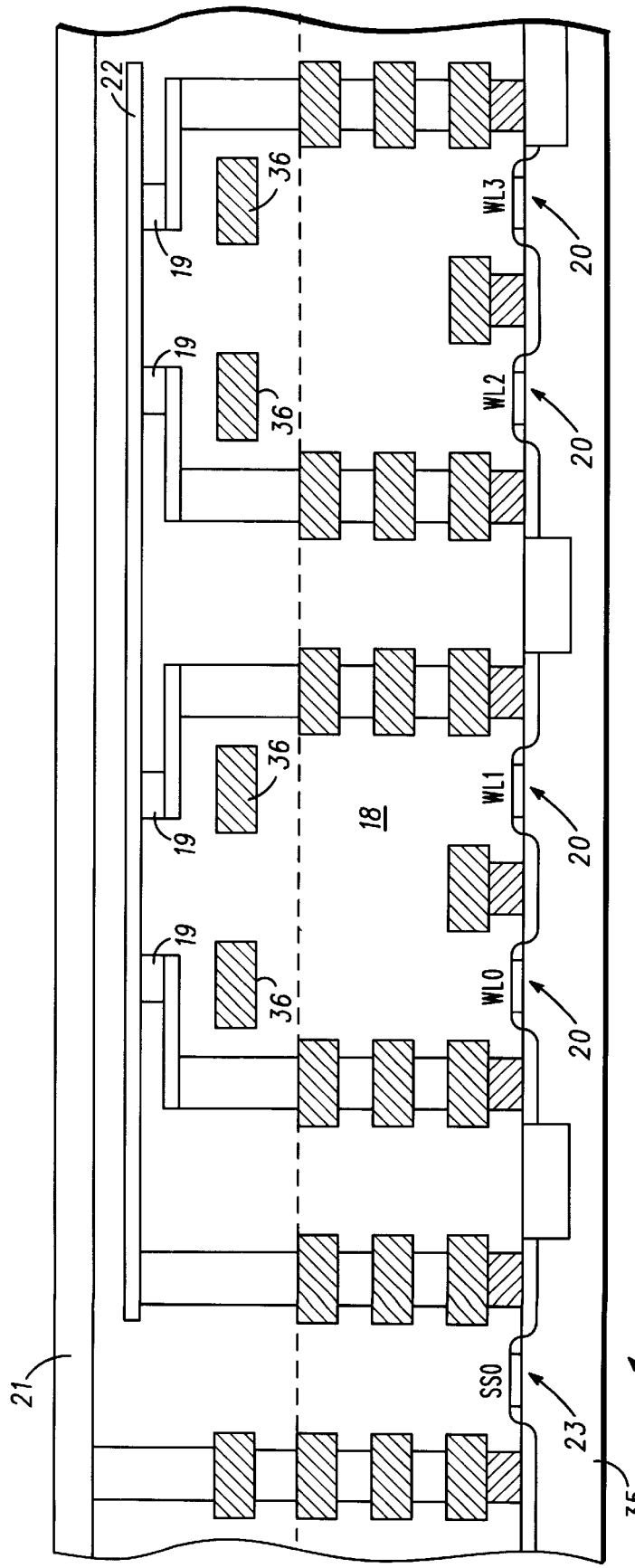
FIG. 3 is a sectional view of a portion of the MTJ array of FIG. 2 illustrating metallization layers and vias integrating the control electronics on a semiconductor substrate.

The entire MTJ memory array and associated electronic circuitry is fabricated on a semiconductor substrate 35. Referring additionally to FIG. 3, a cross-sectional view illustrates metallization layers and vias integrating the control electronics and MTJ cells of group 16 of FIG. 2 on semiconductor substrate 35. Control transistors 20 and select transistor 23 are formed in substrate 35 using standard semiconductor techniques. Word lines $WL_0$ through $WL_{n-1}$ are formed and operate as the gate terminals for control transistors 20 as well as continuing into and out of the figure to form word lines. A group select line SS0 is formed in the same metallization step and also serves as the gate terminal for select transistor 23.

Vias and interconnect lines (illustrated as columns) are formed in subsequent metallization steps to interconnect each MTJ 19 to local bit line 22 and to one terminal of associated control transistor 20. Programming word lines 36 are formed in a subsequent metallization step so as to be closely positioned relative to MTJs 19. Local bit lines 22 are formed in a metalization step in which MTJs 19 are completed. In a final metallization step, column lines or global bit lines 21 are formed generally parallel to local bit lines 22 and perpendicular to programming word lines 36, one for each row (or column) of MTJ cells. Here it should be understood that each bit line 21 can be referred to as a global bit line, since each cell 18 of a group of cells is connected in parallel to a local bit line 22 and thence to a bit line 21, which thereby connects all of the groups of MTJ cells in a column.

For additional information as to the construction and operation of the structure illustrated in FIG. 3, refer to a copending application filed of even date herewith, entitled "High Density MRAM Cell Array", assigned to the same assignee, and incorporated herein by reference. In the specific embodiment illustrated in FIG. 3, programming word lines 36 are positioned below MTJs 19 so that global bit lines 21 can be positioned in closer proximity to MTJs 19, thereby reducing the required programming current and magnetic interaction with adjacent rows (or columns).

Figure 4:
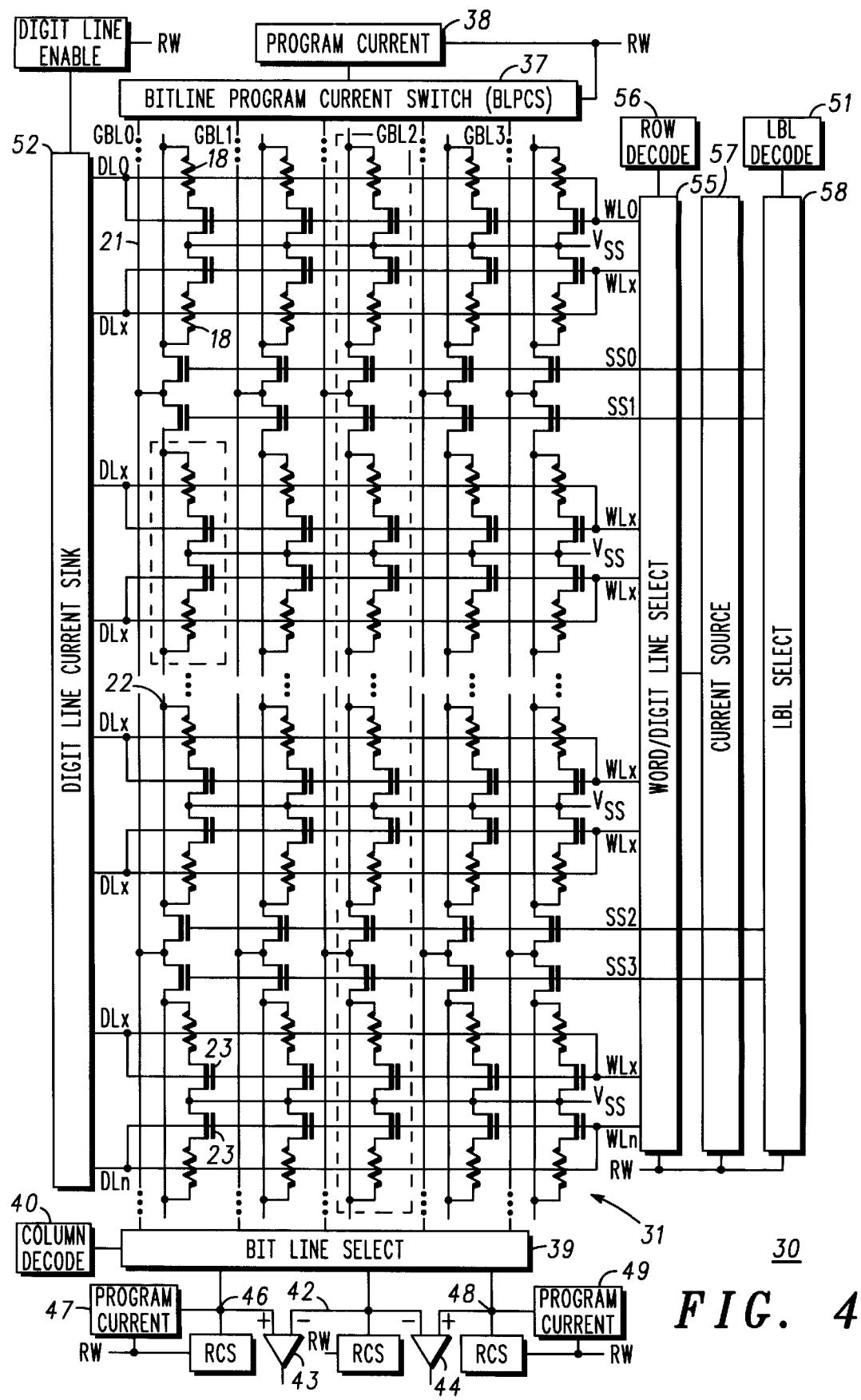
FIGS. 4, 5, and 6 are schematic diagrams of three different circuits for reading/programming a parallel-parallel architecture.

Turning now to FIG. 4, a schematic diagram is illustrated of a MTJ RAM 30, including circuitry for reading/programming a MTJ memory array 31, connected in a parallel-parallel architecture in accordance with the present invention. Array 31 includes a plurality of MTJ cells 18 each including magnetic tunnel junctions 19 and associated control transistors 20 connected in series and arranged in rows and columns. In this example four columns are illustrated with each column including a global bit line GBL0 through GBL3 and a plurality of local bit lines 22 connected to an associated global bit line 21 by select transistors 23. A group n of cells 18 are connected in parallel to each local bit line 22. Here it should be noted that a centrally located column is constructed similar to the other columns but the global bit line is designated REF for reasons that will be explained in more detail presently.

A bit line program current switch 37 is connected to one end of each of the global bit lines GBL0 through GBL3 and to a program current circuit 38 which is constructed to source or sink programming current in the bit lines. The opposite ends of global bit lines GBL0 through GBL3 are connected to a bit line select circuit 39 which has a column decode circuit 40 connected thereto for selecting a specific one of the global bit lines GBL0 through GBL3. Global bit line REF is not connected to bitline program current switch 37 because it is not programmed, since it remains a constant reference. The other end of reference bit line REF is connected through bitline select circuit 39 to a reference data line 42, which is in turn connected to the negative inputs of a pair of comparators 43 and 44.

A first output of bit line select circuit 39 is connected to a junction 46, which is in turn connected to a program current circuit 47 constructed to source or sink programming current (opposite to circuit 38) in global bit lines GBL0 and GBL1. Junction 46 is also connected to a positive input of comparator 43. Junction 46 is connected by circuit 39 to a selected one of global bit lines GBL0 or GBL1 so that the potential on the selected global bit line is compared to the potential on global bit line REF in comparator 43. Similarly, a second output of bit line select circuit 39 is connected to a junction 48, which is in turn connected to a program current circuit 49 constructed to source or sink programming current (opposite to circuit 38) in bit lines GBL2 and GBL3. Junction 48 is also connected to a positive input of comparator 44. Junction 48 is connected by circuit 39 to a selected one of global bit lines GBL2 or GBL3 so that the potential on the selected global bit line is compared to the potential on global bit line REF in comparator 44.

In addition to being arranged in columns and groups, as explained above, cells 18 and select transistors 23 in each group n are arranged in rows. Each row of select transistors 23 has a select line, designated SS0 through SS3, connecting the gates of select transistors 23 to a local bit line select circuit 50, which is in turn controlled by a local bit line decode circuit 51. Each row of series connected cells 18 has a digit (word programming) line, designated DL0 through DLn associated therewith, all of the digit lines being connected at one end to a digit line current sink 52. Also, each row of cells 18 has a word line, designated WL0 through WLn, connected to the gates of each of the control transistors in cells 18. The opposite ends of word lines WL0 through WLn are connected through a word/digit line select circuit 55, which is in turn controlled by a row decoder 56, to a current source 57.

For convenience and simplicity in fabrication, word lines WL0 through WLn are generally formed during the formation of control transistors 19 in each cell 18. Because of the specific process generally used in the fabrication of this type of transistor, the gates and word lines are formed of a doped polysilicon. The problem is that polysilicon has a relatively high resistance and greatly increases the required operating power as well as reducing the operating speed of the MTJ memory array. In many integrated circuits this problem is reduced by metallizing the gates and word lines, i.e. strapping the polysilicon word line with an additional metal line. However, this strapping of the word line substantially increases the size of the MTJ cell structure (MTJ cell and associated control transistor). The strapping of the word lines at the gates of the control transistors requires several additional masking and etching steps and is difficult to control so that the additional steps and all subsequent steps in the process require additional chip real estate.

In the embodiment illustrated in FIG. 4, the strapping problem is overcome by connecting the metal programming digit lines DL0 through DLn to the polysilicon word lines WL0 through WLn, respectively, at spaced apart intervals. These spaced connections are vias, not shown. Since programming digit lines DL0 through DLn are metal and parallel to polysilicon word lines WL0 through WLn, the spaced connections greatly reduce the resistance of polysilicon word lines WL0 through WLn. Further, the formation of programming digit lines DL0 through DLn is much simpler than strapping polysilicon word lines WL0 through WLn, since the position, size, etc. is much less critical than the formation of a metallized gate.

In the specific embodiment illustrated in FIG. 4, programming word lines DL0–DLn are positioned below each associated MTJ 19 so that column lines can be positioned in closer proximity to MTJs 19 (see FIG. 3), thereby reducing the required programming current and magnetic interaction with adjacent rows (or columns). For additional information as to the construction and operation of the structure illustrated in FIG. 3, refer to a copending application filed of even date herewith, entitled "High Density MRAM Cell Array", assigned to the same assignee, and incorporated herein by reference.

Figure 5:
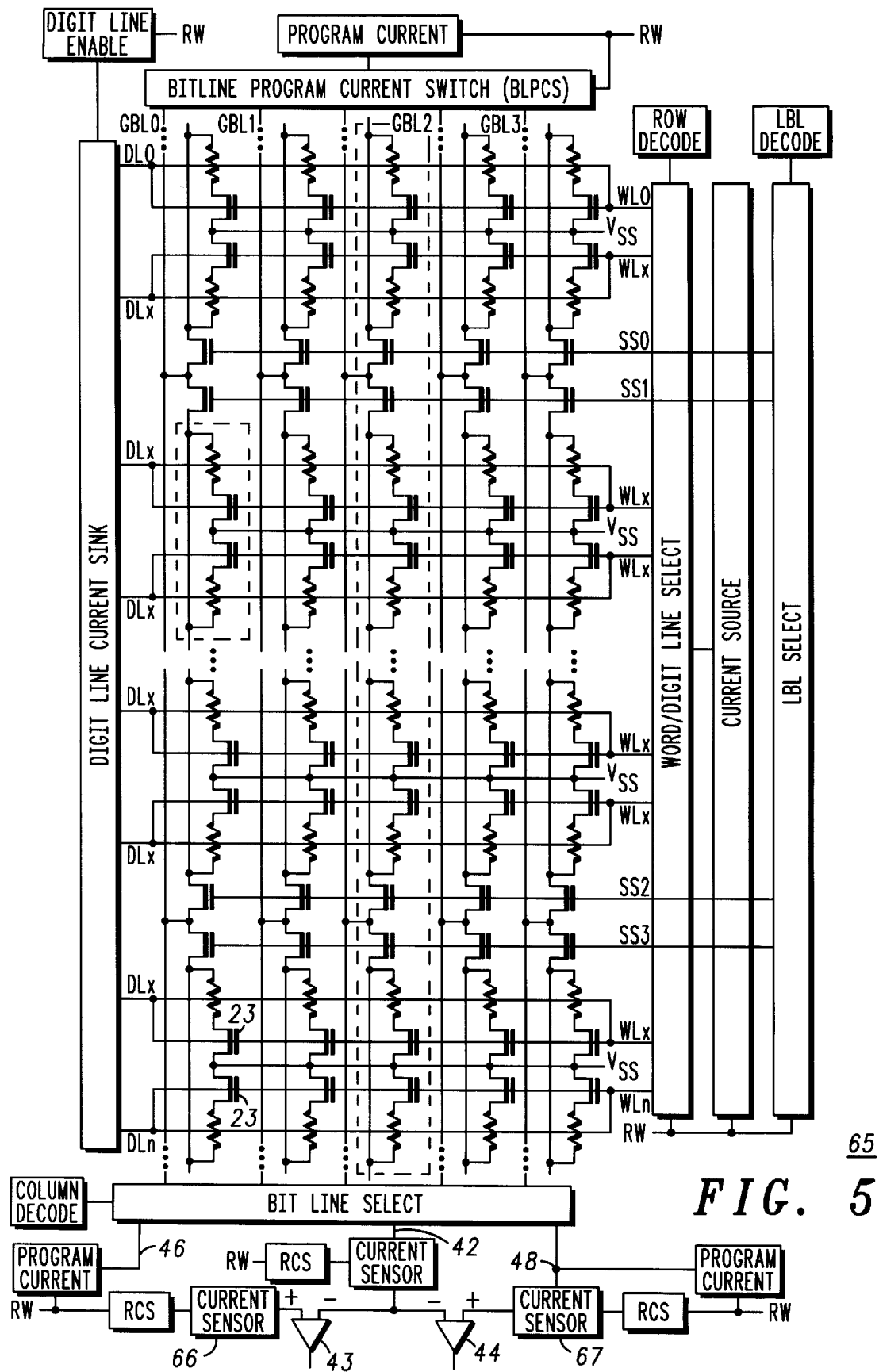

Turning now to FIG. 5, a schematic diagram of an MTJ RAM 65 is illustrated. RAM 65 is similar to RAM 30 of FIG. 4 except that a current sensor 66 is included between the first data output (junction 46) and comparator 43. Also, a current sensor 67 is included between the second data output (junction 48) and comparator 44 and a current sensor 68 is connected between the end of global bit line REF and the negative inputs of comparators 43 and 44. Current sensors 66, 67, and 68 are similar to current conveyors described in a copending application filed Mar. 31, 2000, with Ser. No. 09/540,794, entitled "Current Conveyor and Method for Readout of MTJ Memories", assigned to the same assignee and incorporated herein by reference. Because of the current conveyors, circuit operation and output signals are independent of all process, supply, temperature, and MTJ resistance conditions. Also, because of the current conveyors, voltage swings on data lines or bit lines are virtually eliminated so that the speed of the readout process is greatly increased. Further, the current conveyors operate as a current-voltage converter to improve the operation and the voltage is amplified, to improve readout characteristics.

Figure 6:
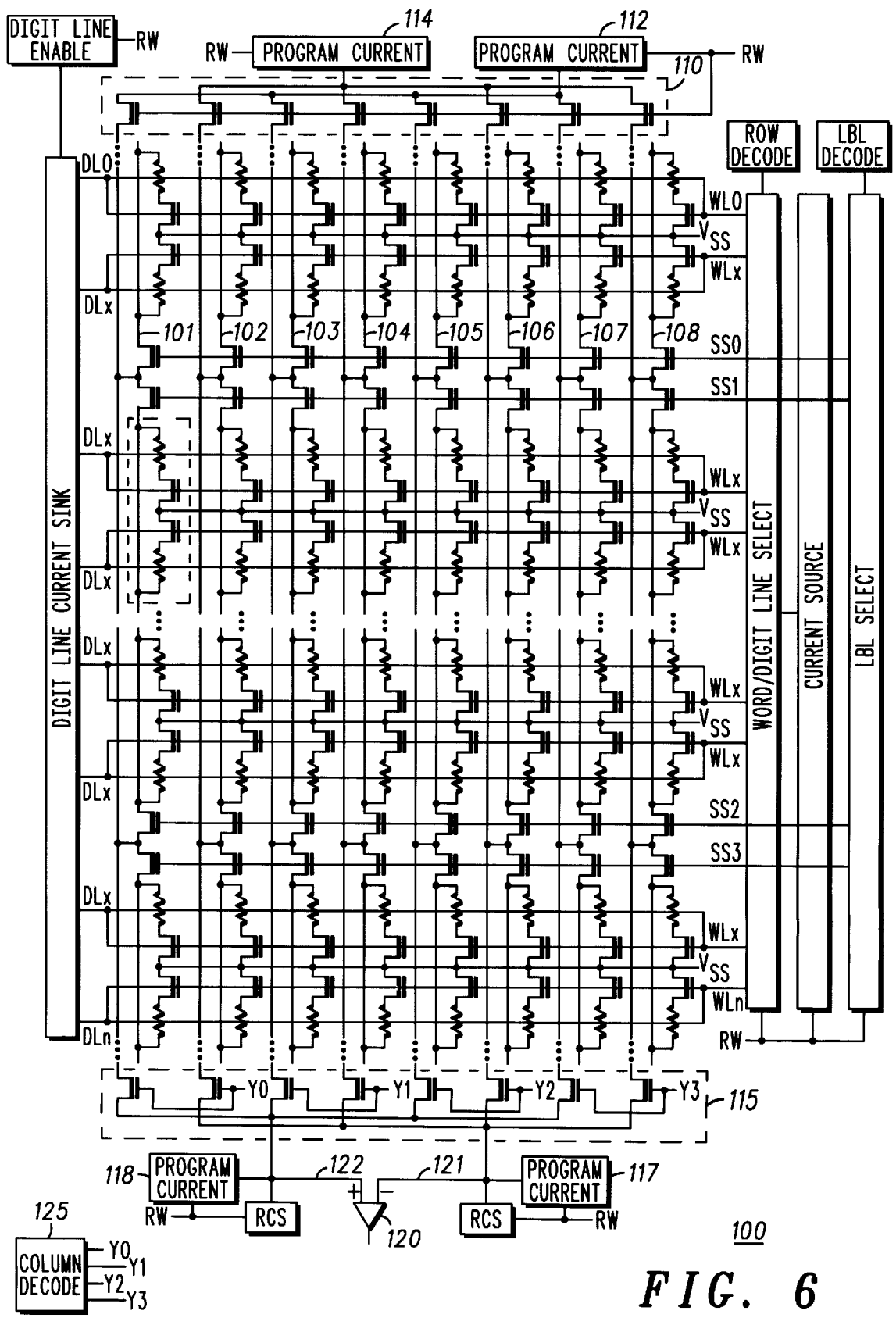

Referring to FIG. 6, another architecture 100 for an MTJ memory array in accordance with the present invention is illustrated. In this embodiment, the MTJ array and row electronics are basically similar to the structure disclosed in conjunction with FIG. 4. The difference in architecture 100 is in the connection of the column electronics and the method of reading stored data. For convenience in understanding, the MTJ array includes eight columns which are numbered consecutively 101 through 108.

The upper end of each global bit line for columns 101 through 108 is coupled to a switching transistor and the eight switching transistors herein form the bit line program current switch 110 controlled by a read/write circuit, designated RW. Switch 110 is designed to connect the global bit lines of columns 101, 103, 105, and 107 to a program current source/sink circuit 112 and the global bit lines of columns 102, 104, 106, and 108 to a program current source/sink circuit 114. Source/sink circuits 112 and 114 are also controlled by read/write circuit RW.

The lower end of each global bit line for columns 101 through 108 is coupled to another switching transistor and the eight switching transistors herein form a bit line select circuit, designated 115. Select circuit 115 is designed to connect the global bit lines of columns 101, 103, 105, and 107 to a program current source/sink circuit 117 and the global bit lines of columns 102, 104, 106, and 108 to a program current source/sink circuit 118. Source/sink circuit 117 operates in conjunction with source/sink circuit 112 and source/sink circuit 118 operates in conjunction with source/sink circuit 114 to provide read and appropriate programming currents to columns 101 through 108. A comparator circuit 120 has a first input terminal 121 connected through select circuit 115 to the lower ends of the global bit lines of columns 101, 103, 105, and 107. Comparator circuit 120 has a 10 second input terminal 122 connected through select circuit 115 to the lower ends of the global bit lines of columns 102, 104, 106, and 108.

A column decode circuit 125 is connected to select circuit 115 so that two columns in proximity but with different current sources and different output circuits are activated simultaneously. In this embodiment, for example, a first output signal Y0 from decode circuit 125 activates the switching transistors at the lower end of the global bit line of columns 101 and 102. A second output signal Y1 from decode circuit 125 activates the switching transistors at the lower end of the global bit line of columns 103 and 104. A third output signal Y2 from decode circuit 125 activates the switching transistors at the lower end of the global bit line of columns 105 and 106. A fourth output signal Y3 from decode circuit 125 activates the switching transistors at the lower end of the global bit line of columns 107 and 108.

Thus, during the read operation, two columns in close proximity are simultaneously connected to opposite input terminals of comparator 120. Comparator 120 then differentially compares the stored bits in the associated pairs of columns. Because of the parallel-parallel architecture of the MTJ array, each column can have virtually any number of local bit lines and each local bit line can include virtually any number of MTJ cells. In this specific example, each MTJ cell in one column (e.g., column 101) will have opposite data to that stored in the corresponding MTJ cell in the associated column (in this example, column 102). Because of the differential comparison of two opposite stored bits, the amount of signal available for readings is effectively doubled, since the available signal does not have to be divided into two to establish a reference level, which is the case in MRAM memories with non-differential sensing. Also, any mismatch between the two MTJ cells being compared will be very small due to the close proximity and identical characteristics of the compared cells. Furthermore, the differential comparisons will be insensitive to variations between the switching transistors in associated columns, as well as voltage and temperature variations and common noise, since the variations and common noise will be present in both columns so as to be processed as common mode by differential comparator 120.

Throughout this disclosure the terms "column" and "row" have been used to describe a specific orientation. It should be understood, however, that these terms are used only to facilitate a better understanding of the specific structure being described and are in no way intended to limit the invention. As will be understood by those skilled in the art columns and rows can be easily interchanged and it is intended in this disclosure that such terms be interchangeable. Also, specific names of the various lines, e.g., bit line, word line, digit line, select line, etc. are intended to be generic names used only to facilitate the explanation and are not intended to in any way limit the invention.

Thus, a new and improved parallel-parallel architecture for MTJ RAMs is disclosed. The new and improved parallel-parallel architecture makes reliable operation of the RAM possible. Further, because of the layout of each bit in the MTJ array, the cell size is smaller resulting in higher density arrays. Also, because of the novel word and digit line connections the operation speed is substantially improved and the operating power is reduced.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. Magnetic tunnel junction random access memory architecture comprising:
    an array of memory cells arranged in rows and columns, each memory cell including a magnetic tunnel junction and a control transistor connected in series; and
    the array of memory cells including a plurality of columns with each column including a global bit line coupled to a control circuit, each column further including a plurality of local bit lines coupled in parallel to the global bit line and a plurality of groups of memory cells with each group including a plurality of memory cells, each of the local bit lines coupled to one of the groups of memory cells, each cell in the plurality of memory cells connected between the local bit line and a reference potential, all of the cells in each of the plurality of memory cells coupled with a particular local bit line being in parallel with one another.

2. Magnetic tunnel junction random access memory architecture as claimed in claim 1 wherein each local bit line includes a control transistor with a control terminal, and the architecture further includes a control line connected to the control terminal of each control transistor in a row of control transistors.

3. Magnetic tunnel junction random access memory architecture as claimed in claim 2 further including a metal programming line extending adjacent to each magnetic tunnel junction in the row and a plurality of vias connecting the metal programming line to the control line at spaced apart intervals.

4. Magnetic tunnel junction random access memory architecture as claimed in claim 3 wherein each memory cell is formed in a stack of layers and the programming line is formed in a layer below the magnetic tunnel junction.

5. Magnetic tunnel junction random access memory architecture as claimed in claim 3 wherein the control transistors are formed in a semiconductor substrate and the control line is formed integrally with the control terminals of the control transistors.

6. Magnetic tunnel junction random access memory architecture as claimed in claim 5 wherein the control line is formed of a doped polycrystalline semiconductor material.

7. Magnetic tunnel junction random access memory architecture comprising:
    an array of memory cells arranged in rows and columns, each memory cell including a magnetic tunnel junction and a control transistor connected in series; and
    the array of memory cells including a plurality of columns with each column including a global bit line coupled to a control circuit, each column further including a plurality of local bit lines coupled in parallel to the global bit line and a plurality of groups of memory cells with each group including a plurality of memory cells connected in parallel between the local bit line and a reference potential;
    one of the columns of memory cells, including a global bit line and local bit lines, connected to provide a reference signal output; and
    an output circuit including a first and a second comparator circuit each having a first input terminal connected to receive the reference signal output and a second input terminal connected to receive a data output signal from at least one global bit line on each opposite side of the reference column, respectively, the first comparator circuit comparing the data output signal from a global bit line on one side of the reference column to the reference signal output and the second comparator circuit comparing the data output signal from a global bit line on an opposite side of the reference column to the reference signal output.

8. Magnetic tunnel junction random access memory architecture as claimed in claim 7 further including a control line connected to the control terminal of each control transistor in a row of control transistors and circuitry coupled to the control line for selecting a local bit line of each global bit line and the reference column.

9. Magnetic tunnel junction random access memory architecture as claimed in claim 8 further including a metal programming line extending adjacent to each magnetic tunnel junction in the row and a plurality of vias connecting the metal programming line to the control line at spaced apart intervals.

10. Magnetic tunnel junction random access memory architecture as claimed in claim 9 wherein each memory cell is formed in a stack of layers and the programming line is formed in a layer below the magnetic tunnel junction.

11. Magnetic tunnel junction random access memory architecture as claimed in claim 9 wherein the control transistors are formed in a semiconductor substrate and the control line is formed integrally with the control terminals of the control transistors.

12. Magnetic tunnel junction random access memory architecture as claimed in claim 11 wherein the control line is formed of a doped polycrystalline semiconductor material.

13. Magnetic tunnel junction random access memory architecture as claimed in claim 7 wherein the output circuit includes a first current sensor connected to the first input terminals of the first and second comparator circuits to receive the reference signal output and second and third current sensors connected to the second input terminals of the first and second comparator circuits to receive the data output signal from the at least one global bit line on each opposite side of the reference column.

14. Magnetic tunnel junction random access memory architecture comprising:
    an array of memory cells arranged in rows and columns, each memory cell including a magnetic tunnel junction and a control transistor connected in series; and
    the array of memory cells including a plurality of columns with each column including a global bit line coupled to a control circuit, each column further including a plurality of local bit lines coupled in parallel to the global bit line and a plurality of groups of memory cells with each group including a plurality of memory cells connected in parallel between the local bit line and a reference potential, and each local bit line including a control transistor;

the control transistors in the local bit lines being arranged in rows and each control transistor including a control terminal, each row of control transistors having a select line attached to the control terminal of each control transistor in the row and to a control circuit for selecting a local bit line of each global bit line; and an output circuit including column select circuitry and a differential comparator circuit having a first input terminal connected through the column select circuitry to receive a first data output signal from a first global bit line and a second input terminal connected through the column select circuitry to receive a second data output signal from a second global bit line, the comparator circuit differentially comparing the first and second data output signals.

15. Magnetic tunnel junction random access memory architecture as claimed in claim 14 wherein memory cells coupled to the first global bit line and memory cells coupled to the second global bit line are connected to have opposite data stored therein.

16. Magnetic tunnel junction random access memory architecture as claimed in claim 14 further including a metal programming line extending adjacent to each magnetic tunnel junction in the row and a plurality of vias connecting the metal programming line to the control line at spaced apart intervals.

17. Magnetic tunnel junction random access memory architecture as claimed in claim 16 wherein each memory cell is formed in a stack of layers and the programming line is formed in a layer below the magnetic tunnel junction.

18. Magnetic tunnel junction random access memory architecture as claimed in claim 16 wherein the control transistors are formed in a semiconductor substrate and the control line is formed integrally with the control terminals of the control transistors.

19. Magnetic tunnel junction random access memory architecture as claimed in claim 18 wherein the control line is formed of a doped polycrystalline semiconductor material.

* * * * *

UNITED STATES PATENT AND TRADEMARK OFFICE
CERTIFICATE OF CORRECTION

PATENT NO.   : 6,272,041 B1
DATED        : August 7, 2001
INVENTOR(S)  : Naji

It is certified that error appears in the above-identified patent and that said Letters Patent is hereby corrected as shown below:

Column 1,
Line 3, after the Title, please add as a new first paragraph the following paragraph:

-- This invention was made with Government support under Agreement No. MDA972-96-3-0016 awarded by DARPA. The Government has certain rights in the invention. --

Signed and Sealed this

Fourth Day of November, 2003

JAMES E. ROGAN
*Director of the United States Patent and Trademark Office*